United States Patent [19]

Yano

[11] Patent Number: 4,751,998
[45] Date of Patent: Jun. 21, 1988

[54] PLATE STOCKER

[75] Inventor: Naoyuki Yano, Yuki, Japan

[73] Assignee: Fujitsu Limited, Kawasaki, Japan

[21] Appl. No.: 790,616

[22] Filed: Oct. 23, 1985

[30] Foreign Application Priority Data

| Oct. 29, 1984 | [JP] | Japan | 59-225675 |
| Oct. 29, 1984 | [JP] | Japan | 59-225676 |
| Oct. 30, 1984 | [JP] | Japan | 59-226674 |
| Oct. 30, 1984 | [JP] | Japan | 59-226675 |
| Oct. 31, 1984 | [JP] | Japan | 59-227977 |

[51] Int. Cl.$^4$ .................................................. G65G 37/00
[52] U.S. Cl. ................................. 198/465.1; 198/502.2
[58] Field of Search ............... 198/464.2, 502.2, 465.1, 198/465.3, 803.01, 803.2, 403, 404, 410, 572, 484.1, 803.13

[56] References Cited

U.S. PATENT DOCUMENTS

| 3,204,756 | 9/1965 | Lesch | 198/465.1 |
| 3,268,055 | 8/1966 | Stein et al. | 198/572 X |
| 3,902,587 | 9/1975 | Checcucci | 198/465.1 X |
| 3,937,316 | 2/1976 | Gerhardt | 198/465.1 |
| 4,320,826 | 3/1982 | Kramer et al. | 198/465.1 X |

Primary Examiner—Robert J. Spar
Assistant Examiner—D. Glenn Dayoan
Attorney, Agent, or Firm—Staas & Halsey

[57] ABSTRACT

A plate stocker comprises plate inlet and outlet stations for feeding plates, one by one, in flat state in the horizontal direction toward and from a plate stock section, respectively. The stock section comprises: a looped-rail extending between the plate inlet and outlet stations and having upper and lower horizontal rail sections, and a plurality of holders freely movably supported along the looped-rail, capable of holding plates in an upright state when the holders are supported on the upper rail section of the looped-rail. The plates are received, one by one, by turning the plates from the horizontal to the vertical state to transfer them to the holders. The holders are automatically engaged by a belt and move along the upper rail section toward the outlet station while holding plates and move along the lower rail section backward to the inlet station while not holding plates. Stoppers are arranged on the upper and lower rail sections to disengage the holders from the belt.

9 Claims, 15 Drawing Sheets

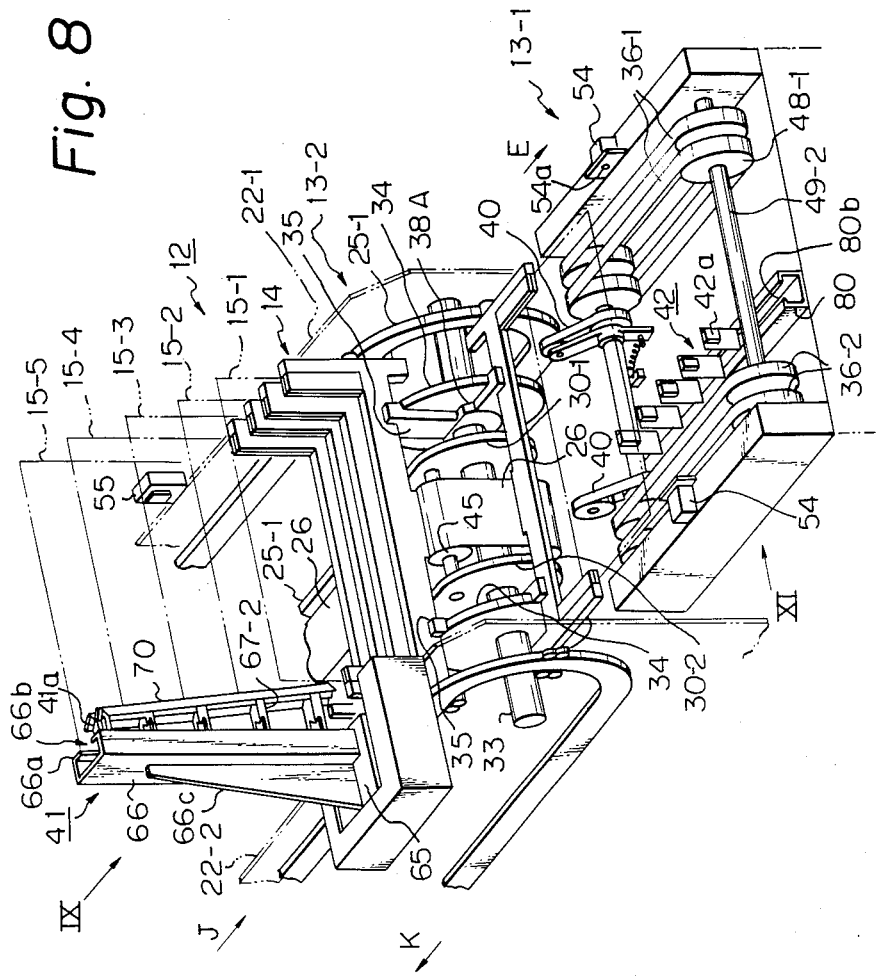

PLATE STOCKER

BACKGROUND OF THE INVENTION

1. Field of the Invention

This invention relates to a plate stocker adaptable to temporarily stock metal or non-metal plate members, such as rectangular substrates for printed circuit boards, hereinafter referred to simply as—plates—, having a regular or irregular size, length, or width. Such a plate stocker is also adaptable to be situated between two adjacent processes in a plate making or working line in order to receive the plates, one by one, from the preceding process and feed the plates, one by one, to the subsequent process.

2. Description of the Related Art

In a plate making or working line, such as for printed circuit substrates, there are generally several processes, each provided with a working machine, inspecting or measuring installation, and so forth, and these processes constitute a working line through which the plates are transferred. However, the plate feeding speed is not constant in the respective processes, due to differences in the size, length, width, or thickness of the plates, and differences in the working capacity of the respective processes. Therefore, it is usually necessary to insert a stocker between adjacent preceding and subsequent processes.

A plate stocker having, for example, a belt or chain conveyor means for receiving the plates from the preceding process and discharging the plates to the subsequent process is widely known in the prior art. However, such belt or chain conveyor means cannot usually conduct the plate receiving and discharging operations independently of each other. Therefore, if the plate feeding speed of the preceding process is different from that of the subsequent process, the above-mentioned type plate stocker usually cannot smoothly receive the plates at a speed in accordance with the preceding process and also usually cannot smoothly discharge the plates at a speed in accordance with the subsequent process.

SUMMARY OF THE INVENTION

Accordingly, an object of the present invention is to provide a plate stocker capable of independently receiving and discharging the plates, even if the plate feeding speed is different between the preceding and subsequent processes.

Another object of the present invention is to provide a plate stocker capable of automatically receiving and discharging the plates.

A further object of the present invention is to provide a plate stocker capable of being arranged between adjacent processes in a plate making or working line and capable of stocking a large number of plates in an upright state.

According to the present invention, there is provided a plate stocker comprising: a plate inlet station, a plate stock section, and a plate outlet station; the plate stock section comprising: a looped-rail extending between the plate inlet station and plate outlet station and having a first rail section and a second rail section; a plurality of plate holders freely movably supported along the looped-rail; means for moving the holders around the looped-rail so that the holders move along the first rail section toward the outlet station while holding plates and move along the second rail section backward to the inlet station while not holding plates, the moving means including engaging means for automatically engaging with and disengaging from the holders to move and stock the plates.

Further, according to the present invention, there is provided a plate stocker comprising: a plate inlet station, a plate stock section, and a plate outlet station; the plate inlet and outlet stations comprising means for feeding plates one by one in a flat state in the horizontal direction toward and from the plate stock section, respectively; the plate stock section comprising: a looped-rail extending between the plate inlet station and plate outlet station and having an upper horizontal rail section and a lower horizontal rail section; a plurality of plate holders freely movably supported along the looped-rail, the holders being capable of holding plates in an upright state when the holders are supported on the upper rail section of the looped-rail; means for receiving the plates one by one from the plate inlet station by turning the plates from the horizontal state to the vertical state to transfer them to the holders; means for moving the holders along the looped-rail so that the holders move along the upper rail section toward the outlet station while holding plates and move along the lower rail section backward to the inlet station while not holding plates, the moving means including engaging means for automatically engaging with and disengaging from the holders to move and stock the plates; stoppers arranged on the upper and lower sections of the looped-rail at downstream sides thereof, respectively, with respect to the direction of the movement of the holders, the stoppers being capable of disengaging the holders from the moving means, and means for discharging the plates one by one from the holders in the plate stock section by turning the plates from the vertical state to the horizontal state to transfer them to the plate outlet station.

In an embodiment of the present invention, each of the holders is movably supported on the looped-rail so that the holder extends outward from and perpendicular to the rail, the extension of the holder defines a U-shaped frame viewed from the direction of the movement of the holder in the upper rail section, and the U-shaped frame has an inner groove for receiving a plate therein.

In another embodiment of the present invention, the looped-rail has semi-circular sections at the plate receiving and discharge means, respectively; the plate receiving means comprises means for turning each of the holders from the downward extending position to the upward extending position thereof along the semi-circular section of the looped-rail, the turning means comprising a driving disc rotatably supported about an axis of the semi-circular section, a plurality of arms radially arranged on the disc at certain intervals, so as to radially project outward and retract inward, and a cam for moving the arms radially outward to engage the arm with the holder at its downward extending position and radially inward to disengage the arm from the holder at its upward extending position; the plate discharge means is constructed in the same manner as the plate receiving means, but reversely arranged by 180° with respect thereto; and the plate outlet station comprises means for detecting the plates when each of the plates passes through a predetermined position on the plate outlet station, thereby a disc is driven in response to the plate detecting means so that a subsequent plate is transferred from the plate discharge means to the plate outlet station after a preceding plate has passed through a predetermined position.

In another embodiment of the present invention, the moving means comprising an endless belt arranged along the looped-rail so as to run in the vicinity of the holders; engagement members (such as, magnets or magnetic materials) arranged on the endless belt and the holders for automatically engaging with each other to feed the holders when the endless belt is driven; and stoppers arranged on the first and second sections of the looped-rail at downstream sides thereof, respectively, with respect to the direction of the movement of the holders, the stoppers being capable of disengaging the holders from the engagement members of the endless belt to stop the holders.

In another embodiment of the present invention, each of the stoppers comprises a pair of rod members which are each arranged so as to extend into and retract from a holder passage defined by the looped-rail to stop and release the holder, respectively, so that when one of the rod members stops a holder, the other rod member can stop a subsequent holder.

In another embodiment, there is provided means for detecting the height or length of the plates in the upright position arranged adjacent to the plate discharging means; and means for detecting the plates when each of the plates passes through a predetermined position in accordance with the height or length of the plate.

In still another embodiment, there is provided stock control means comprising means for detecting an unusual condition of the subsequent process, means for stopping the preceding process when the stock section is filled with plates, and means for stopping the discharging means when a subsequent process is not in a normal condition.

BRIEF DESCRIPTION OF THE DRAWINGS

FIG. 8 is a perspective view of a part of the plate stocker according to the present invention, illustrating the plate discharge means and plate outlet station;

DESCRIPTION OF THE PREFERRED EMBODIMENTS

Figure 1:
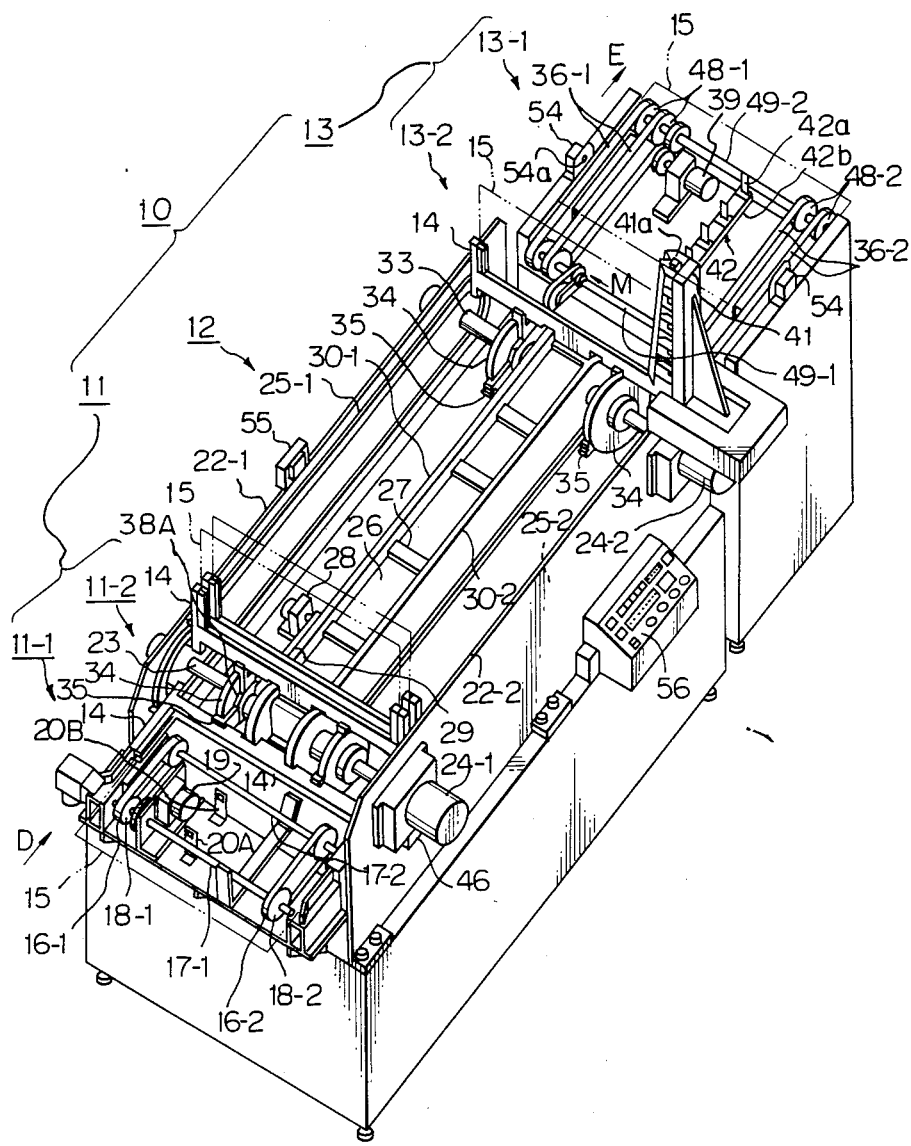
FIG. 1 is a perspective view of an embodiment of a plate stocker according to the present invention.

Referring now to the drawings, FIG. 1 generally shows an embodiment of a plate stocker 10 according to the present invention, which generally includes a plate inlet station 11, a stocker section 12, and a plate outlet station 13. The plate inlet station 11 generally includes plate inlet passage means 11-1 and a plate receiving means 11-2. The stocker section 12 includes a pair of looped-rails 25-1 and 25-2 arranged between the receiving means 11-2 of the inlet station 11 and a plate discharge means 13-2 of the outlet station 13, a plurality of plate holders 14 freely movable along the rails, and an endless belt 26 for moving the holders 14. The plate outlet station 13 includes the above-mentioned plate discharge means 13-2 and plate discharge passage means 13-1. Thus, the plates 15, for example, printed circuit substrates, are fed one by one from the inlet passage 11-1 in the horizontal direction indicated by an arrow D, then received by the holders 14 at the receiving means 11-2, and transported in an upright position to the stocker section 12, where the plates 15 are temporarily stocked. The plates 15 are then moved one by one to the discharge passage 13-1, by the discharge means 13-2, in a horizontal state in the direction indicated by an arrow E.

Plate Inlet Station

Referring now to FIGS. 1 to 5, the plate inlet passage 11-1 includes a pair of left and right endless belts 16-1 and 16-2, for example, rubber timing belts, pairs of front and rear pulleys 18-1 and 18-2, for example, timing pulleys, for engaging with these belts, a pair of front and rear shafts 17-1 and 17-2 rotatably supported at respectived sides for supporting the pulleys 18-1 and 18-2, a motor 19 (in FIG. 1) for driving the driving shaft 17-1 via a power transmission unit including gears, not illustrated in detail, and a pair of front and rear sensors, such as optical reflection sensors 20A and 20B.

The sensor 20A detects the plate 15 when it comes onto the belts 16-1 and 16-2 and sends a signal to a control unit, not illustrated. After receiving the signal, the control unit sends a rotate command to the drive motor 19. Thus, the belts 16-1 and 16-2 are driven in the direction indicated by an arrow D, so that the plate 15 on the belts 16-1 and 16-2 is moved toward the receiving means 11-2. The plate 15 is then held by a plate receiving groove 14d of one of the holders 14, which has been waiting in a horizontal position aligned with the path of the plate 15 in the plate inlet station 11.

The sensor 20B detects the plate 15 when it comes to the position at which the plate 15 is received by the holder 14, as mentioned above, and sends a signal to the control unit. After receiving the signal, the control unit sends a drive command to the receiving means 11-2 to turn the holder 14 holding the plate 15 along the rails 25-1 and 25-2 and feed the plate in an upright position as indicated by an arrow G.

Figure 5:
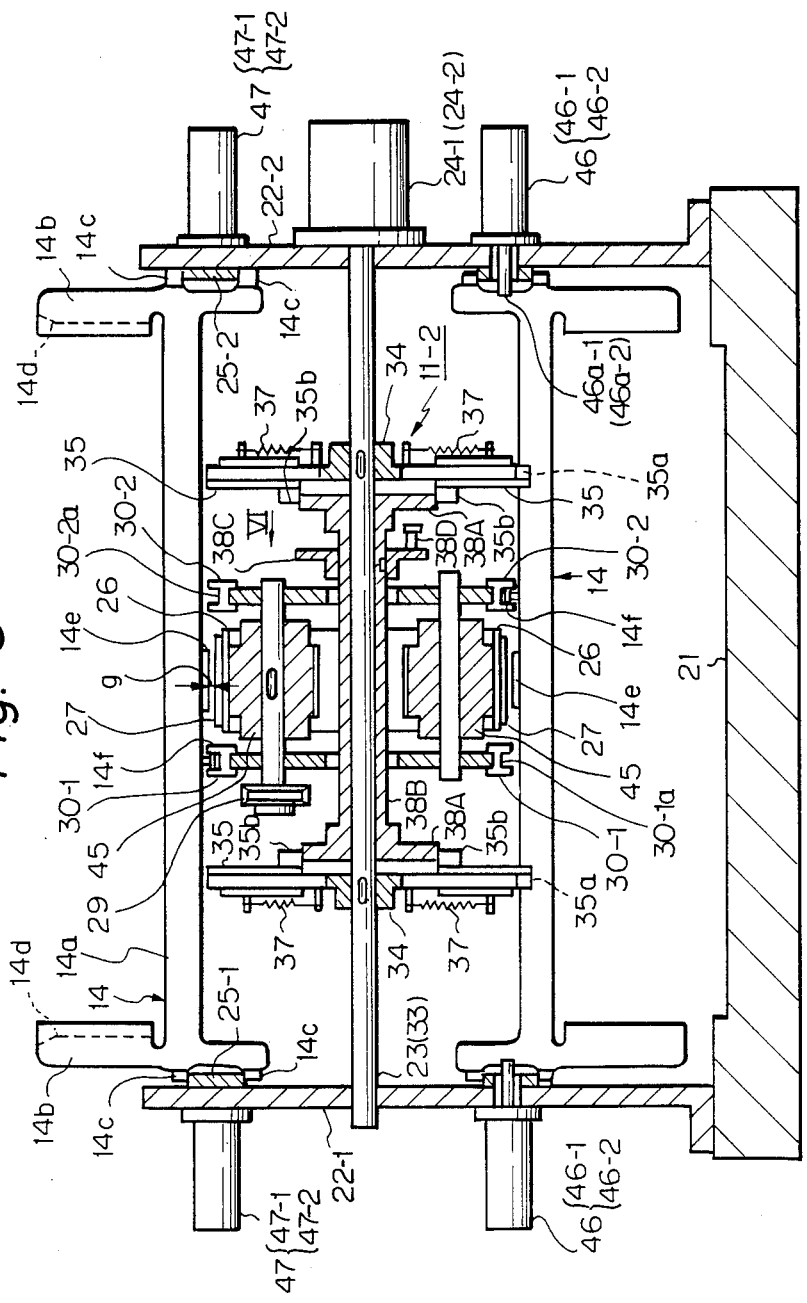
FIG. 5 is a cross-sectional view taken along a line V—V in FIG. 2 or FIG. 3.

The receiving means 11-2 includes a supporting shaft 23 supported by a pair of left and right vertical side plates 22-1 and 22-2. The supporting shaft 23 is connected to and intermittently rotated by an indexing unit 24-1 by 90°. A pair of left and right discs 34 are rigidly secured to the shaft 23. Four arms 35 are radially mounted on each disc 34, which arms are spaced regularly by 90° and slidable in the radial direction. Each arm 35 has at its free end an engaging groove 35a for holding therein each holder 14 and is usually biased radially inward by a tension coil spring 37 (FIG. 5). Thus, the inner end of the arm 35 is usually in contact with the outer periphery of a rotating cam 38A, so that the arm 35 is rotated by the disc 34 on the one hand, and slid radially by the cam 38A on the other hand.

Figure 6:
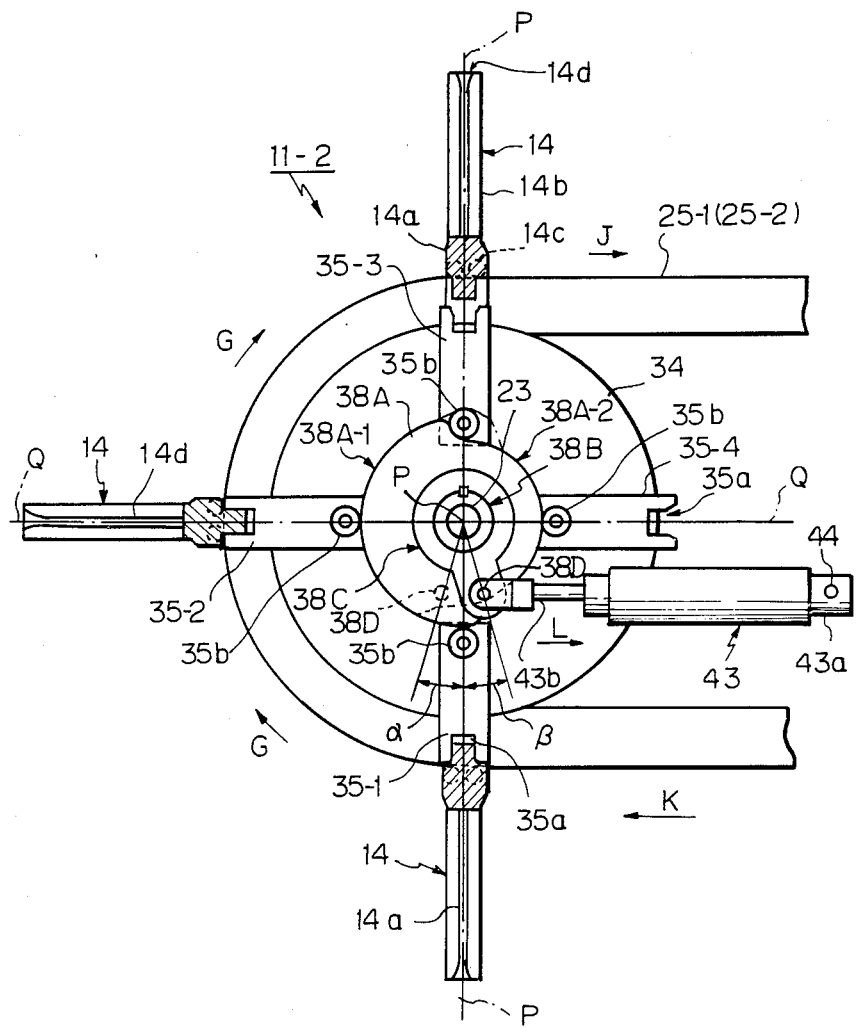
FIG. 6 is an enlarged view seen from an arrow VI in FIG. 5, illustrating the construction and operation of the plate receiving and discharge means including a cam and arm driving mechanism.

As shown in FIG. 5, the cams 38A are fixedly mounted on and driven by an outer cylindrical hollow shaft 38B which is rotatably mounted on the supporting shaft 23 and driven independently of the supporting shaft 23 by any suitable driving means, such as a cylinder 43 (FIG. 6), via a driving disc 38C and a pin 38D. In FIG. 6, the cylinder 43 is pivotably connected at its base end 43a to a fixed pin 44 and at the free end of its piston rod 43b to the pin 38D fixed to the driving disc 38C. As mentioned above, each of the arms 35 (in FIG. 6, indicated at 35-1, 35-2, 35-3 and 35-4) is radially urged inward to the outer periphery of the cam 38A via a roller 35b rotatably mounted on the arm at its inner end. The cam 38A includes a larger diameter cam surface 38A-1 and a smaller diameter cam surface 38A-2. Therefore, when the cam 38A is swung within the range indicated by angles $\alpha$ and $\beta$ by the piston rod 43a, the arms 35-1 to 35-4 on the discs 34 are slid radially. Consequently, when the roller 35b of each arm 35 runs on the larger diameter cam surface 38A-1, the arm 35 projects outward to engage with one of the holders 14. On the other hand, when the roller 35b of each arm 35 runs on the smaller diameter cam surface 38A-2, the arm 35 retracts inward to disengage from the holder 14. In this embodiment, the angle $\alpha$ is substantially the same as the angle $\beta$ and both angles $\alpha$ and $\beta$ total about 30°. The cam 38A is first in a position at which the pin 38D is located at a position indicated by the angle $\alpha$ (as shown by a dotted line in FIG. 6). The lower arm 35-1 now under the center P is urged inward by the smaller-diameter surface 38A-2 of the cam 38A and is in a position where it is disengaged from the lower holder 14 under the center P. On the other hand, the upper arm 35-3 now above the center P is pushed outward by the larger diameter surface 38A-1 of the cam 38A and is in a position where it is engaged by the upper holder 14 above the center P. The cam 38A is then moved to a position indicated by the angle $\beta$, as shown in a solid line in FIG. 6, by the movement of the pin 38D from $\alpha$ to $\beta$. The lower arm 35-1 is moved downward by the larger diameter cam surface 38A-1 to extend outward and come into engagement through an engaging groove 35a with the holder 14 which has been stopped under the center. On the other hand, the upper arm 35-3 moves inward and releases the holder 14 above the center P, since the roller 35b of that arm moves along the smaller cam surface 38A-2. Therefore, the released upper holder 14 is fed along the rails 25-1 (25-2) in the direction as shown by an arrow J to the stocker section 12 (FIGS. 1, 2 and 3) as will be mentioned later. At the same time, the arm 35-2 is now aligned on the horizontal line Q and is in contact with the larger diameter cam surface 38A-1 to hold the holder 14 in a horizontal state, which receives and holds by the receiving groove 14d thereof the plate 15 (FIG. 2) coming in the horizontal state via the inlet passage 11-1. On the other hand, the remaining arm 35-4 is positioned on the smaller cam surface 38A-2 not holding plates. Then, the arm 35-1 holding the holder 14 is rotated in the direction indicated by an arrow G by 90° to the horizontal position Q, i.e., to the position where the arm 35-2 was previously located, since the roller 35b runs on the larger diameter cam surface 38a-1. Simultaneously, the arm 35-2 rotates to the position of 35-3, 35-3 to 35-4, and 35-4 to 35-1, respectively. Then, the cam 38A returns to the original position corresponding the pin 38D at $\alpha$. After the arm 35-1 has moved to the position where the arm 35-2 was previously located and the holder 14 receives and holds the subsequent plate in the same manner as mentioned above with reference to the arm 35-2, the arm 35-1 is again rotated by 90° by the disc 34 to the vertical position, i.e., the position where the arm 35-3 was previously located, to release the holder 14. Then, the arm 35-1 is again returned by the disc 34 to its initial position over the position where the arm 35-4 was previously located, and repeats, in turn, the same operations as mentioned above. The above arms 35-2, 35-3, 35-4 perform the same operations as the arm 35-1 at the positions spaced away from adjacent one by 90°, in turn. Thus, the receiving means 11-2 receives, one by one, the plates 15 coming from the inlet passages 11-1 (FIG. 2) and intermittently rotates by 90°, in turn, to feed the plates 15 to the stocker section 12 in the vertical state.

Stocker Section

Figure 2:
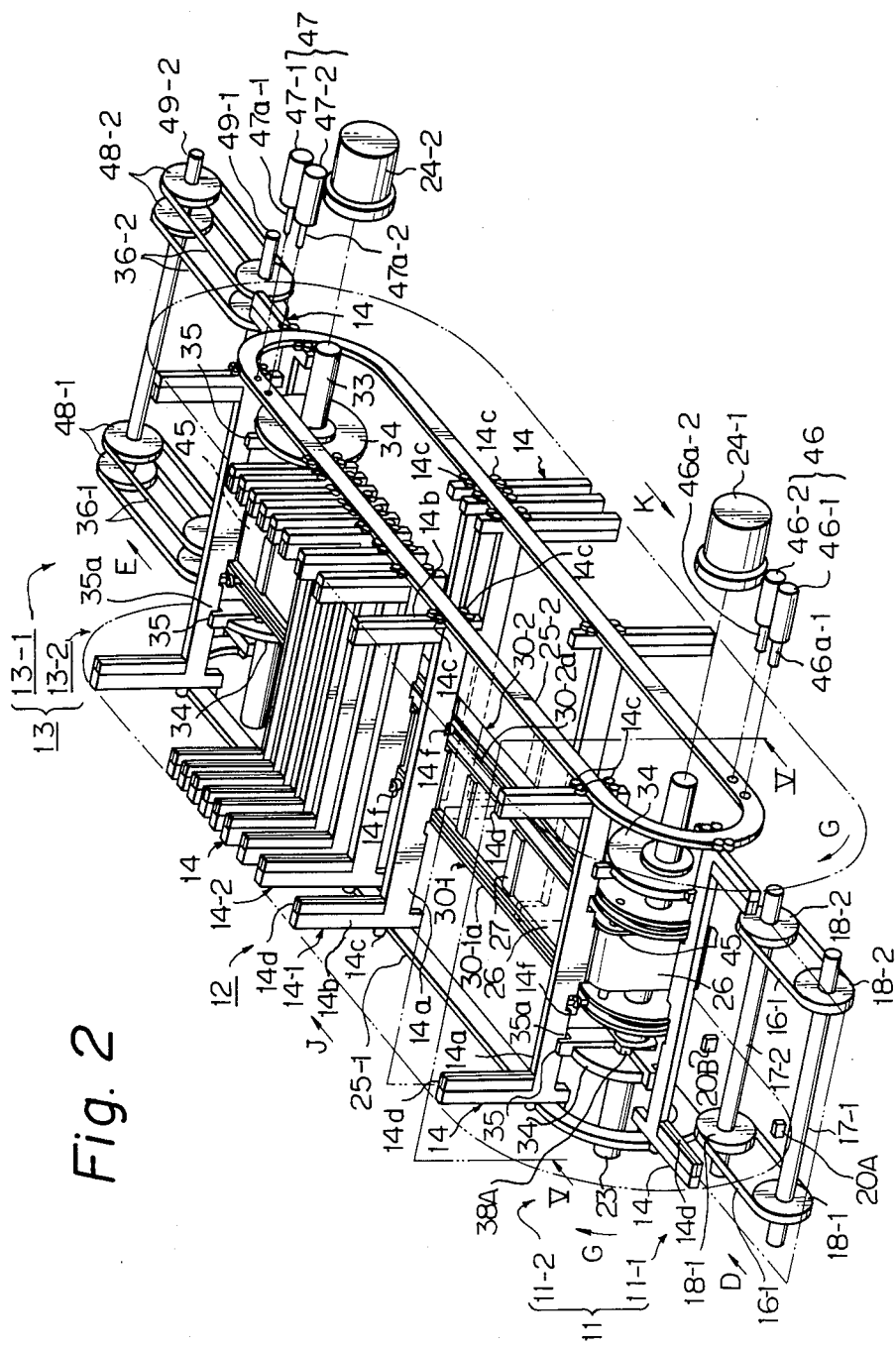
FIG. 2 is a detailed perspective view illustrating a main part of the plate stocker shown in FIG. 1.
Figure 3:
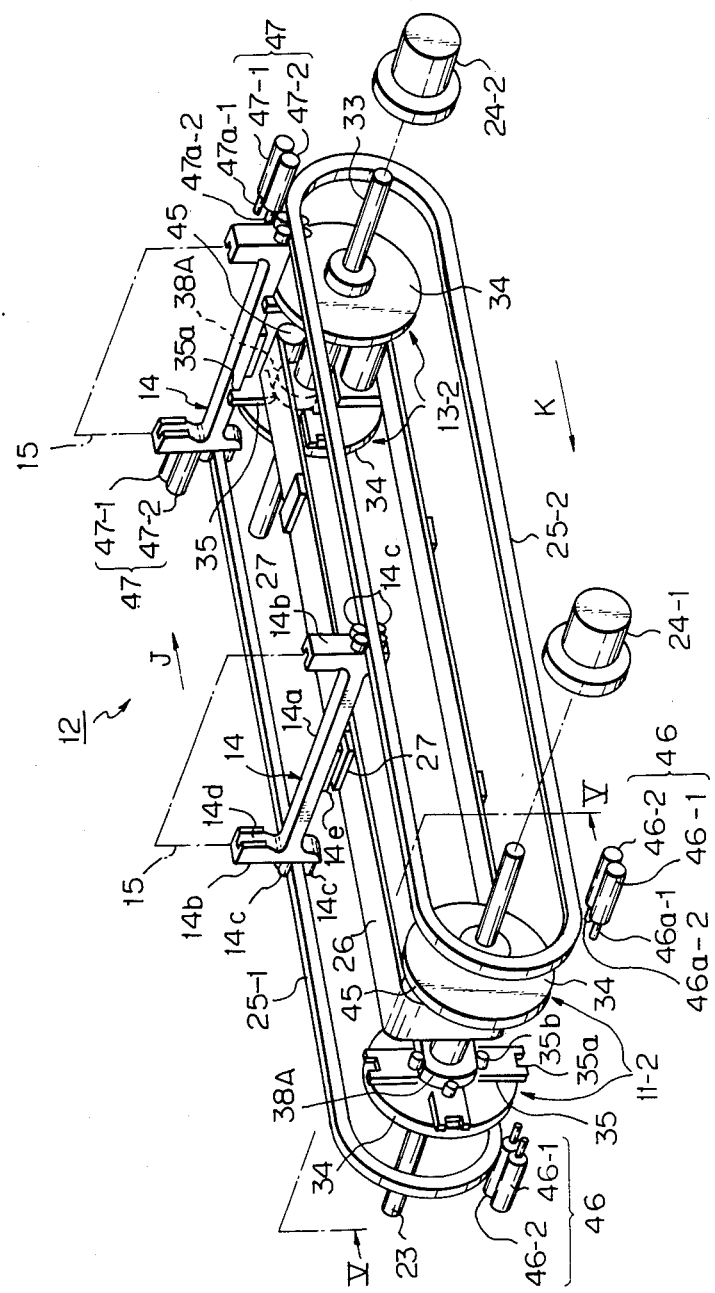
FIG. 3 is a perspective view of a part of the plate stocker, showing the looped-rails and plate holders.
Figure 4:
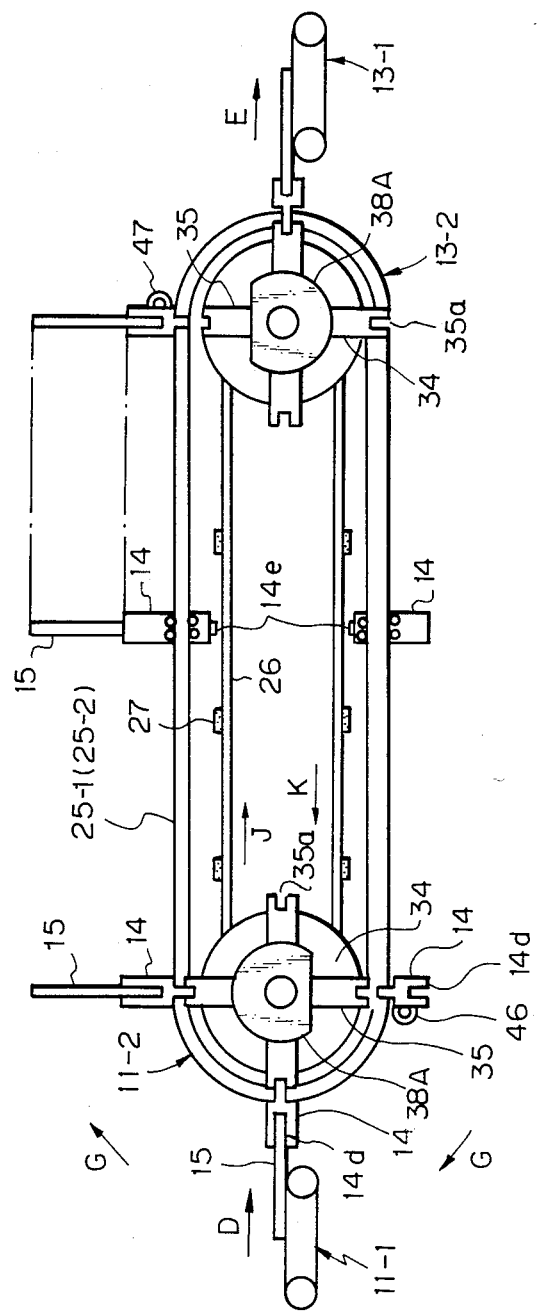
FIG. 4 is a side elevational view of a part of the plate stocker, schematically illustrating the looped-rails and plate holders.

In order to connect the receiving means 11-2 to the discharge means 13-2, a pair of left and right looped-rails 25-1 and 25-2 are arranged on a pair of left and right side plates 22-1 and 22-2 of the base 21 (FIG. 5). The looped-rails 25-1 and 25-2 define upper and lower horizontal rail sections. A number of holders 14 are arranged on the rails 25-1 and 25-2 so as to be freely movable therearound. The holders 14 each have a H-shaped body comprising a transverse member 14a and two side members 14b and 14b. On each end of the transverse member 14a, four rollers 14c (FIGS. 3 and 5) are freely rotatably mounted. Two pairs of these upper and lower rollers 14c are arranged to clamp the respective rails 25-1 and 25-2. The respective side members 14b of the holder 14 are provided with inner receiving grooves 14d for receiving the plate. A magnetic member 14e (or magnet) is attached to the bottom center of the transverse member 14a. Opposite to the magnetic members 14e, an endless belt 26 (flat or timing belt) is arranged for transferring the holders 14, which belt 26 extends over four pulleys 45 and between the receiving means 11-2 and discharge means 13-2. These pulleys 45 comprise two pairs of upper and lower rollers 45 arranged at the front end (receiving means 11-2) and the rear end (discharge means 13-2), respectively. In addition, one of the four rollers 45 is connected through a belt 29 (FIGS. 1 and 5) to a driving motor 28 (FIG. 1) and rotated thereby to drive the endless belt 26 in the clockwise direction as indicated by arrows J and K. The belt 26 has a plurality of magnets 27 regularly spaced, for example, by about 400 mm pitch, and positioned in the vicinity of an end opposite to the magnetic members 14e of the holders 14. Therefore, as shown in FIG. 2, when the belt 26 moves in the direction as shown by arrow J (arrow K), the freely-supported holders 14 move in the upright state in the direction indicated by the arrows J and K, since the magnetic member 14e thereof is attracted to the magnet 27, so that the holders 14 are stocked by stoppers 46 and 47 between the receiving means 11-2 and the discharge means 13-2, as will be mentioned hereinafter. The speed of the belt 26 is advantageously set to be about twice the speed of the working line, so that the holders 14 are fed quickly to be kept fully stocked in the stocker section 12. For instance, if the speed of the working line is about 1.6 m/sec, it is advantageous that the speed of the belt 26 be set at about 3 m/sec. The magnet 27 is rigidly mounted on the belt 26 by means of a mounting plate (not shown) at the respective ends of the magnet 27. The mounting plate has at the respective ends thereof rollers (not shown), which, when the magnet 27 attracts the magnetic member 14e of the holder 14, are in contact with the bottom surface of the transverse member 14a and define a small gap g (FIG. 5), for instance, of about 0.5 mm, between the magnet 27 and the magnetic member 14e so as to prevent direct contact between the two and thus prevent the generation of noise and to smooth the movement of the belt 26. Adjacent to and outside of the belts 26, a pair of left and right looped guide rails 30-1 and 30-2 are arranged between the receiving means 11-2 and the discharge mean 13-2. On the outer peripheries of the guide rails 30-1 and 30-2, looped guide grooves 30-1a and 301b are provided. On the other hand, each of the holders 14 is provided at the bottom thereof with a roller 14f which engages with either one of the left and right guide grooves 30-1a and 30-1b. Consequently, as seen from FIG. 2, the guide rollers 14f of the adjacent front and rear holders indicated at 14-1 and 14-2 are so arranged as to engage with the right guide groove 30-2a and left guide groove 30-1a, respectively. Thus, the guide rollers 14f are alternately arranged at left and right sides for respective adjacent holders 14. Therefore, the distance between the adjacent front and rear holders 14 can be as small as possible. In addition, such an arrangement of the rollers 14f serves to prevent the holders 14 from being held at an oblique angle by the guide grooves 30-1a and 30-2a, while the holders 14 move along the looped-rails 25-1 and 25-2.

Stop Means

Figure 7A:
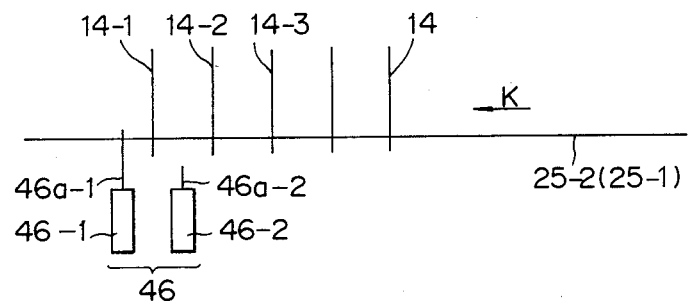
FIGS. 7A to 7E are schematic views illustrating the operations of the stoppers.
Figure 7B:
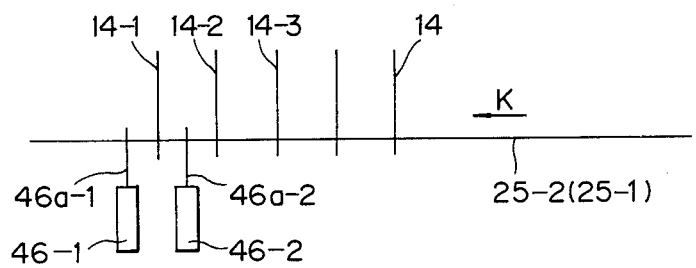
Figure 7C:
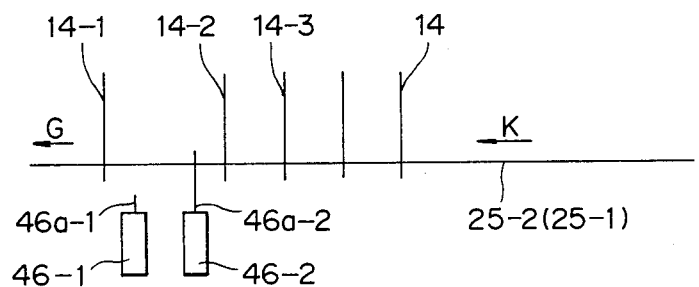
Figure 7D:
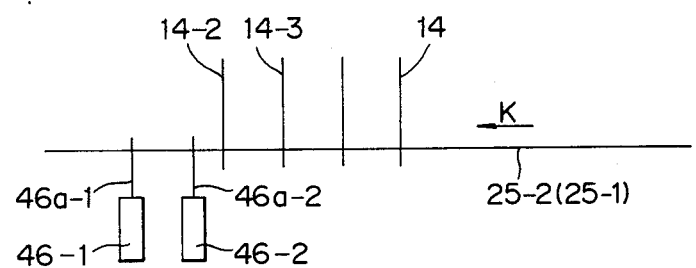
Figure 7E:
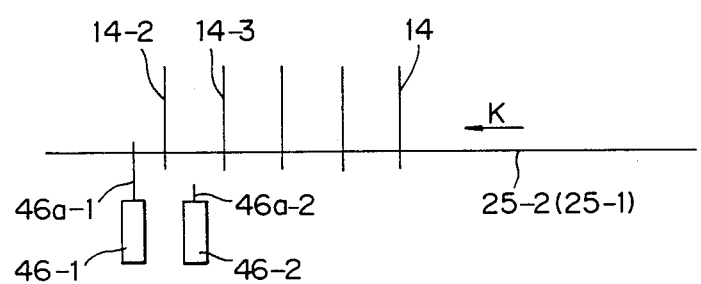

Stop means 46 and 47 are arranged at the upstream sides of the receiving means 11-2 and discharge means 13-2, respectively. Each stop means comprises two pairs of left and right symmetrically arranged parallel cylinders 46-1 and 46-2, and 47-1 and 47-2 mounted on the side plates 22-1 and 22-2, respectively, having piston rods 46a-1, 46a-2, and 47a-1, 47a-2, respectively, which are movable to and fro through the side plates 22-1 and 22-2 and the looped-guide rails 25-1 and 25-2. The structure and function of the stop means 46 is the same as those of the stop means 47, and therefore one 46 of the stop means will be explained in detail with reference to FIGS. 7A to 7E, in which reference numeral 25-2 (25-1) indicates the looped-rail, in the same way as the above, and 14-1, 14-2, and 14-3, particular holders to be explained. As seen from FIG. 7A, the piston rod 46a-2 is retracted. On the other hand, the piston rod 46a-1 is extended forward to stop the holder 14-1 fed in the direction K (the direction from the discharge means 13-2 (FIGS. 2 and 3) toward the receiving means 11-2) along the rail 25-2, so that the arriving holders 14-2, 14-2, . . . , 14-n are, in turn, stopped and stocked in the stocker section 12. Then, as shown in FIG. 7B, the piston rod 46a-2 is extended forward to hold the holder 14-1 in a predetermined position between these two rods, and at the same time, to stop and stock the holders 14-2, . . . The position of this holder 14-1 corresponds to the position where the holder 14-1 under the vertical center P (FIG. 6) is engaged by the arm 35-1 extended outward of the disc 34, as mentioned with reference to FIG. 6. The piston rod 46a-1 is then retracted, as shown in FIG. 7C, to release the holder 14-1 from the stop means 46. The released holder 14-1 is then fed in the direction indicated by arrow G by the arm 35-1 (FIG. 6). The piston rod 46a-1 is then extending again, as shown in FIG. 7D. Then, the piston rod 46a-2 is retracted so that the holders 14-2, 14-3, . . . are stopped by the piston rod 46a-1, as shown in FIG. 7E, which shows the same position as FIG. 7A. The piston rods 46a-1 and 46a-2 repeat the same operations as described above, so that the arriving holders 14-2, 14-3, . . . are, in turn, indexed in the same manner as described above. the extending of the piston rod 46a-1 in FIG. 7D and the retracting of the piston rod 46a-2 can be either simultaneously or separately carried out. As understood from the above, the stocker section 12 serves to stock a number of holders 14 and feed them, one by one, from the receiving means 11-2 to the discharge means 13-2, respectively.

Plate Outlet Station

In the discharge means 13-2 of the plate outlet station 13, a supporting shaft 33 is rotatably supported on the left and right side plates 22-1 and 22-2 and driven by 90° indexing means 24-2 connected thereto, as seen from FIG. 2. The construction and operation of this discharge means 13-2 are basically the same as those of the above-mentioned receiving means 11-2, but arranged in an 180°-reversed relationship with respect to the front-to-rear direction. Therefore, the discharge means 13-2 comprises the same or similar elements as those of the receiving means 11-2 and discharges the holders 14, which have been stocked in the upright state in the stocker section 12 in cooperation with the stop means 47, to the outlet passage 13-1, one by one, by turning them from the upright to the horizontal state. The discharge means 13-2 is operated independently of the receiving means 11-2.

The outlet passage 13-1 is arranged adjacent to the discharge means 13-2. The construction of this outlet passage 13-1 is basically the same as that of the inlet passage 11-1. Consequently, two pairs of left and right endless conveyor belts 36-1 and 36-2, such as rubber timing belts, are arranged in the plate outlet station 13. Pairs of front and rear pulleys 48-1 and 48-2, such as timing pulleys, of these belts are secured to a pair of front and rear shafts 49-1 and 49-2 which are rotatably supported on the left and right side frames. The driving shaft 49-2 is connected to a driving motor 39 (FIG. 1) arranged adjacent thereto. A sensor plate 42 (FIG. 1) provided with a plurality of plate detecting sensors 42a, such as optical reflection sensors, is longitudinally disposed between the shafts 49-1 and 49-2. The outlet passage 13-1 is so constructed that the belts 48-1 and 48-2 are constantly moved in the clockwise direction (shown by an arrow E at the upper belt sections) by the motor 39 to feed the plates 15, which have been discharged from the discharge means 13-2, in the direction indicated by an arrow E to the following working line.

Length Detecting Means

Figure 9:
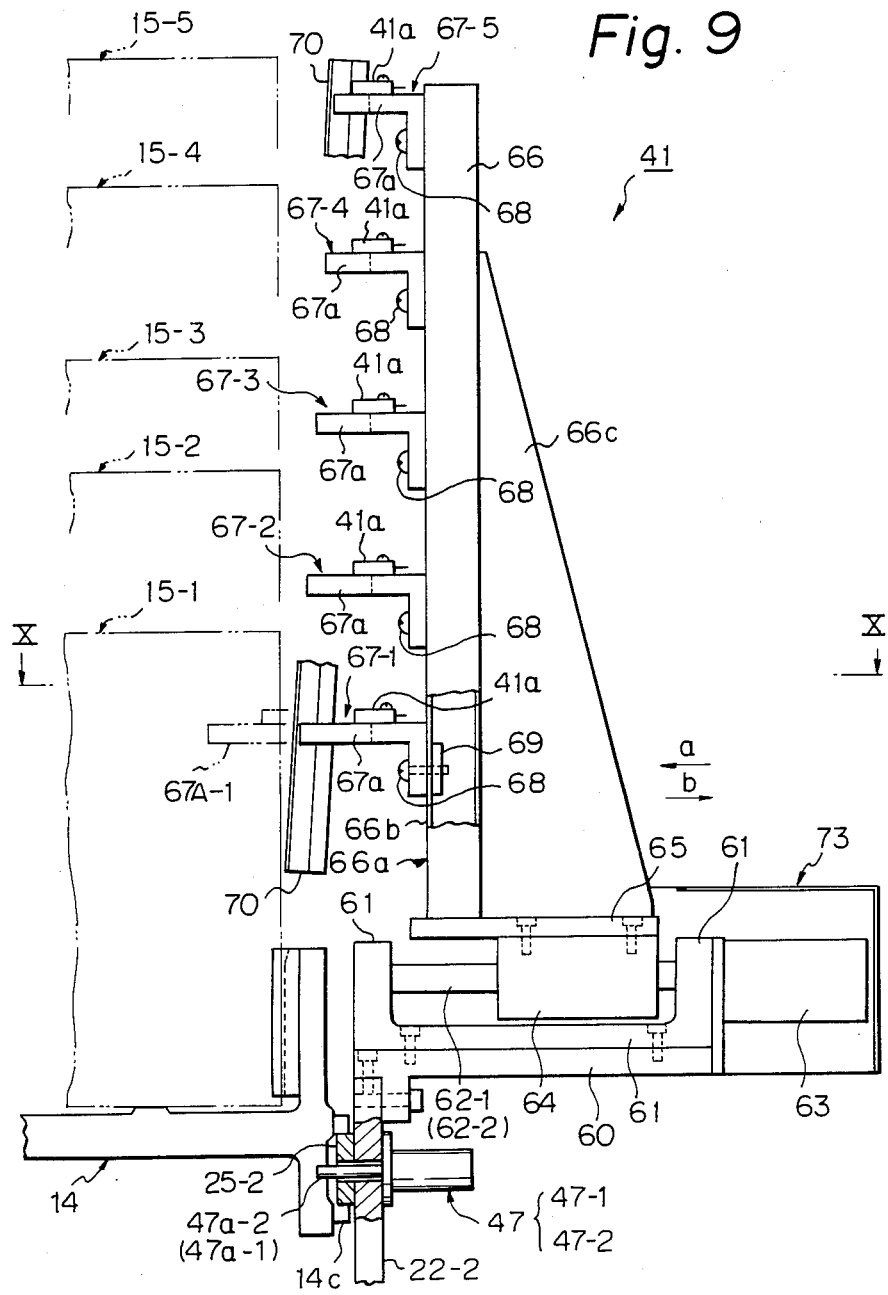
FIG. 9 is an enlarged view seen from an arrow IX in FIG. 8, illustrating the plate length detecting means.
Figure 10:
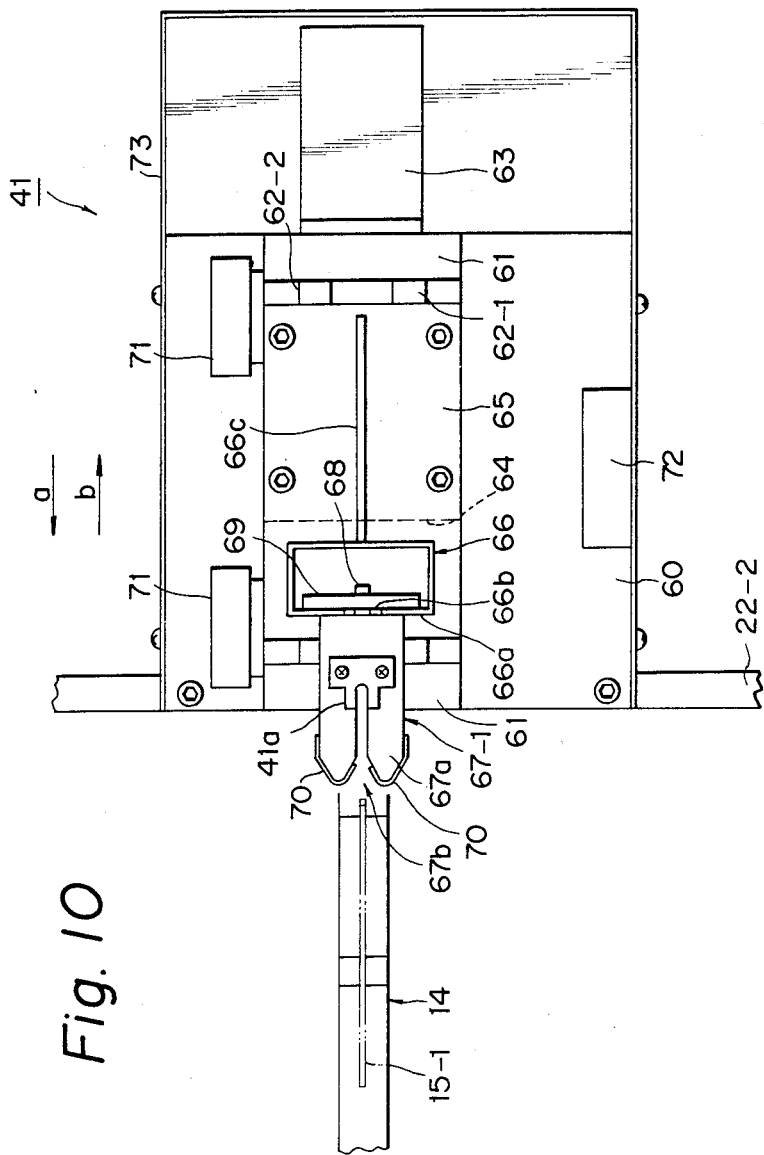
FIG. 10 is a horizontal cross-sectional view taken along line X—X in FIG. 9.
Figure 11:
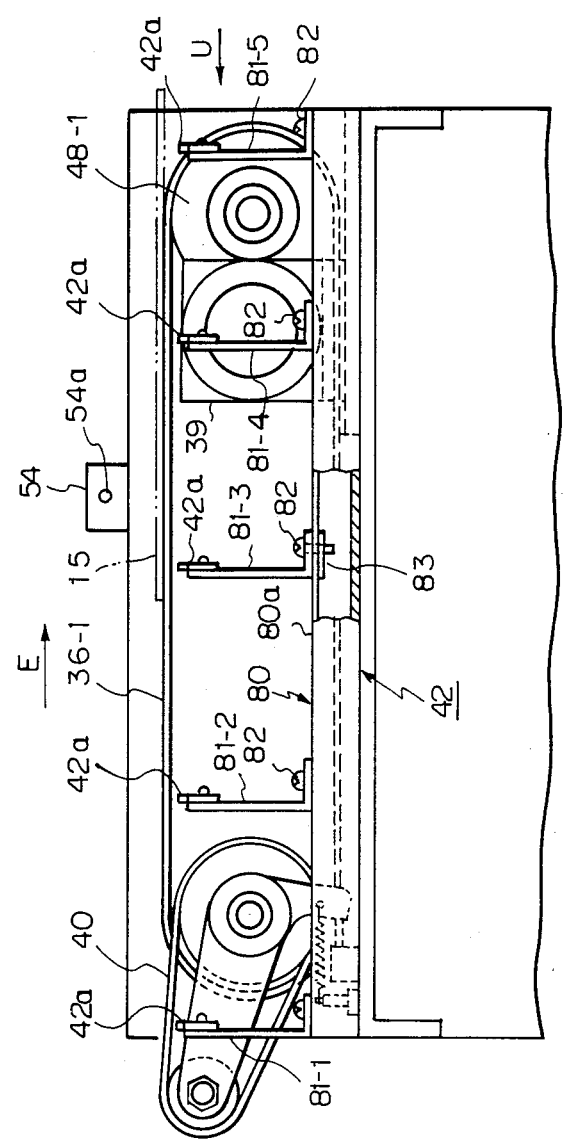
FIG. 11 is a side elevational view seen from an arrow XI in FIG. 8, illustrating the plate detecting means.
Figure 12:
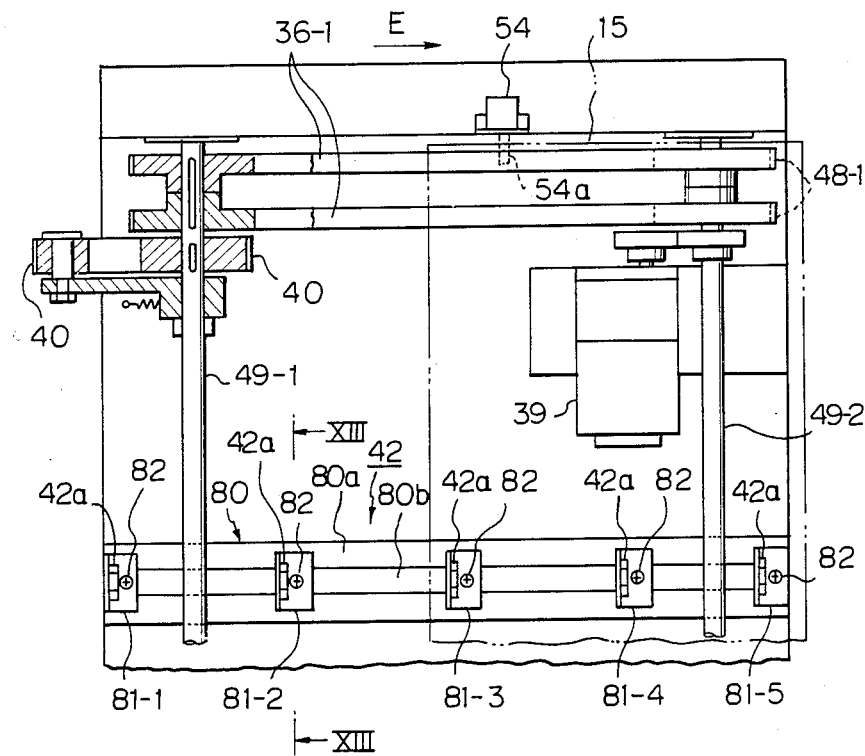
FIG. 12 is a top plan view seen from an arrow XII in FIG. 11, illustrating the plate detecting means.
Figure 13:
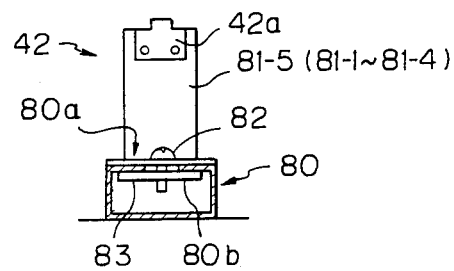
FIG. 13 is a cross-sectional view taken along line XIII—XIII in FIG. 13.

In FIGS. 8, 9, and 10, length detecting means 41 is provided on one 22-2 of the side plates adjacent to the plate discharge means 13-2. On the side plate 22-2 is rigidly mounted a base member 60 to which a U-shaped supporting block 61 is secured by screw members. A pair of hollow cylindrical guide pipes 62-1 and 62-2 are mounted in parallel to each other on the supporting block 61. A cylinder block 64 is slidingly mounted on the guide pipes 62-1 and 61-2. The cylinder block 64 is provided therein with pneumatic drive means, not shown in the drawings, which is actuated by air pressure fed and discharged through the supporting guide pipes 62-1 and 62-2 by means of a solenoid air changing valve 63, so that the cylinder block 64 is reciprocally moved to and fro in the direction indicated by arrows a and b, in FIG. 9. However, a hydraulic drive, cylindrical cam, screw feeder, or magnetic drive means also can be used as driving means for the cylinder block 64, as will be easily understood by a person skilled in the art.

The cylinder block 64 is provided thereon with a base plate 65 on which an upright column 66 having a hollow rectangular cross-section and a reinforcement rib 66c is rigidly mounted. The column 66 is provided on an inner wall 66a thereof with a longitudinal slit 66b. A plurality of (in this embodiment; five) guide members 67-1, . . . , 67-5 spaced at predetermined intervals and extending toward the plates 15 are mounted on the inner wall 66a of the column 66 by means of screws 68 passing through the slit 66b and mounting pieces 69 disposed inside the column 66. The positions of these guide members 67-1, . . . , 67-5 can be adjusted along the column 66. The transverse length of these guide members 67-1, . . . , 67-5 is such that an upper member is, in turn, shorter than a lower member. The guide members 67-1 . . . , 67-5 are provided with respective plate guide slits 67b, the bottom of which are aligned in a vertical line parallel to the upright column 66. An optical sensor 41a is provided in the bottom of the guide slit 67b of each guide members 67-1 . . . , 67-5. In this embodiment, the five guide members 67-1, 67-2, . . . , 67-5 are positioned to correspond to the five kinds of plates 15-1, . . ., 15-5 having different heights or lengths, respectively. In other words, the guide member 67-1 corresponds to the plate 15-1 and is arranged at a position slightly lower than the top edge thereof. The guide member 67-2 corresponds to the plate 15-2 and is arranged at a position between the top edge thereof and the upper edge of the plate 15-1. The guide member 67-3 corresponds to the plate 15-3 and is arranged at a position between the top edge thereof and the top edge of the plate 15-2. The guide member 67-4 corresponds to the plate 15-4 and is arranged at a position between the top edge thereof and the top edge of the plate 15-3. In the drawings, reference numeral 70 indicates a pair of guide plates arranged along the projected ends of the guide members 67-1, . . . , 67-5; 71 (FIG. 10), limit switches; 72, electric connector; and 73, a cover screwed to the base member 60.

For instance, if the shortest plate 15-1 is transported and held by the above-mentioned stopper 47 (FIGS. 2 and 3), the cylinder block 64 is then moved forward in the direction indicated by an arrow a, in FIG. 9 so that the guide member 67-1 is extended with the other guide members 67-2, . . . to a position shown in dotted-line 67A-1 (FIG. 9) until the side edge of the plate 15-1 is received by the guide slit 67b and arrives at a position where the sensor 41a is located. Then, only the signal of the sensor 41a, which detects the side edge of the plate 15-1, is input to the control unit, not illustrated. Then, the guide member 67-1 returns with the column 66 to its initial position.

If, for instance, the longest plate 15-5 is transported and held at the predetermined position, the cylinder block 64 is then moved forward in the same manner as mentioned above and, accordingly, the guide member 67-1, first, then the guide members 67-2, . . . , 67-5, in turn, receive with their guide slits 67b the side edge of the plate 15-5, until the side edge of the plate 15-5 is received by all these guide slits 67b and comes to a position where the sensors 41a of all these guide members are located. Then, all the sensors 41a are turned on and the signals of all these sensors are input to the control unit. In the same manner as above, for the plate 15-4 four sensors 41a are turned on, for the plate 15-3 three sensors 41a are turned on, and for the plate 15-2 two sensors 41a are turned on. These signals are, of course, input to the control unit. Therefore, as clearly understood from the above, the length detecting means 41 detects the length of the plate 15, which is not an actual length, but a degree of length. The number and arrangement of guide members 67-1, . . . , 67-5 can, of course, be selected in accordance with the number or kinds of the plates 15.

Plate Sensor

In FIGS. 8, 11, 12, and 13, the plate sensor 42 is arranged along the horizontal outlet passage 13-1 in the plate discharge direction indicated by an arrow E. Consequently, a longitudinal base frame 80 having a hollow rectangular cross-section is arranged along the plate discharge direction E. The base frame 80 has an upper wall 80a and a longitudinal slit 80b along the upper wall 80a, on which a plurality of (in this case, five) supporting members 81-1, . . . 81-5, each having a L-shaped cross-section, are rigidly mounted by means of screws 82 passing through the slit 80b and mounting plates 83 disposed in the hollow frame 80. These supporting members 81-1, . . . 81-5 can, of course, be adjusted in their positions in the longitudinal direction E by means of these screws 82 and mounting plates 83. A reflection type optical sensor 42a is mounted on the upper portion of each of the supporting members 81-1, . . . , 81-5. These optical sensors 42a are positioned under and adjacent to the plates 15 (shown by dotted line in FIG. 11) being discharged by the belts 36-1 and 36-2 and arranged in the plate discharge direction E correspondingly to the above-mentioned plate detecting sensors 41, i.e., to the respective plates 15-1, . . . , 15-5. That is to say, the sensor 42a of the supporting member 81-1 corresponds to the sensor 41a of the guide member 67-1 (FIG. 9), the sensor 42a of the supporting member 81-2 corresponds to the sensor 41a of the guide member 67-2, and in the same way for the sensors 42a of the other supporting members.

As understood from the above, the plate sensor 42 constructed as mentioned above is capable of detecting the positions on the outlet passage 13-1 through which the respective five kinds of plates 15-1, 15-2, . . . pass. If the shortest plate 15-1 is first discharged and next the plate 15-2 which is longer than the plate 15-1 is discharged, when the rear edge of the plate 15-1, which has been caught by the holder 14, passes through the sensor 42a of the corresponding supporting member 18-1, this sensor 42a is actuated to input a signal to the control unit (not shown). Thus, when the rear edge of the plate 15 (for example, plate 15-1), which is now being discharged by the belts 36-1 and 36-2 of the outlet passage 13-1, passes through the sensor 42a which corresponds to the next coming plate 15 (for example, plate 15-2), the sensor 42a in question is actuated to send a signal to inform the control unit that the plate 15 now being discharged is passing through a position on the outlet passage 13-1 which corresponds to the length of the coming plate 15, as follows.

The plate length detecting sensor 41 detects the length of the plate 15 (for example, plate 15-1) and inputs a signal to the control unit (not shown). The control unit now activates the plate sensor 42a which corresponds to the plate in question in accordance with the signal from the length detecting sensor 41. When the rear edge of the preceding plate 15 passes through the sensor 42a in question, the latter detects it and sends a signal to the control unit, which then activates the discharge means 13-2. The discharge means 13-2 thus discharges the plate 15 onto the outlet passage 13-1 with a predetermined gap with respect to the preceding plate 15. Accordingly, in this embodiment, several kinds of plates having different lengths can be discharged, one by one, with a predetermined gap (for example, about 20 mm) between the plate in question and the preceding plate. The gap can, of course, be adjusted by selecting the positions of the plate sensors 42a, considering the time during which the discharge means 13-2 moves the plate 15 from an upright state to a horizontal state onto the outlet passage 13-1.

A pair of left and right plate stoppers 54 each comprises a cylinder or the like having a rod 54a which can be projected inward to the plate outlet passage. When the discharge means 13-2 discharges the plate 15 onto the outlet passage 13-1, the plate 15 can be temporarily stopped at a position above and adjacent to the outlet passage 13-1 (for example, at a position where the plate is inclined by 5° with respect to the horizontal plane) by the rods 54a being projected inward until the preceding plate 15 passes through a predetermined position. After that, the plate 15 in question is discharged onto the discharge passage 13-1 by retracting the rod 54a outward. As understood from the above, these plate stoppers 54 serve to maintain a predetermined constant gap between the adjacent plates. However, in the case of a long plate, the stoppers 54 also serve to prevent the plate in question from coming into contact with the preceding plate when the plate is temporarily stopped.

Stock Control

Figure 14:
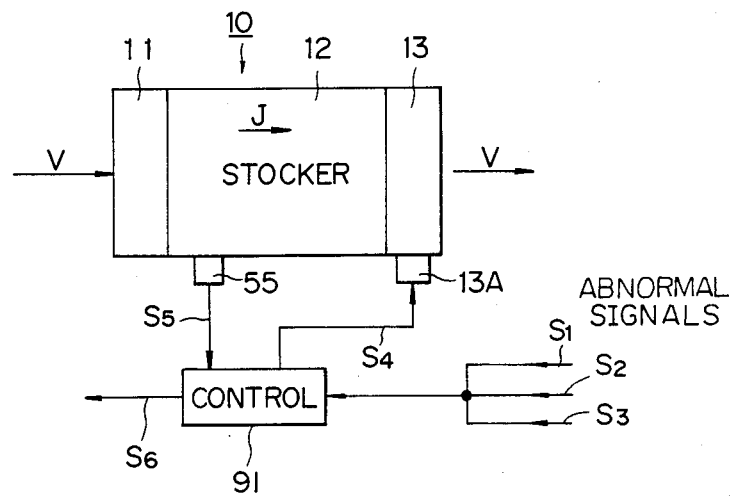
FIG. 14 is a schematic block diagram illustrating a stocker control unit.
Figure 16:
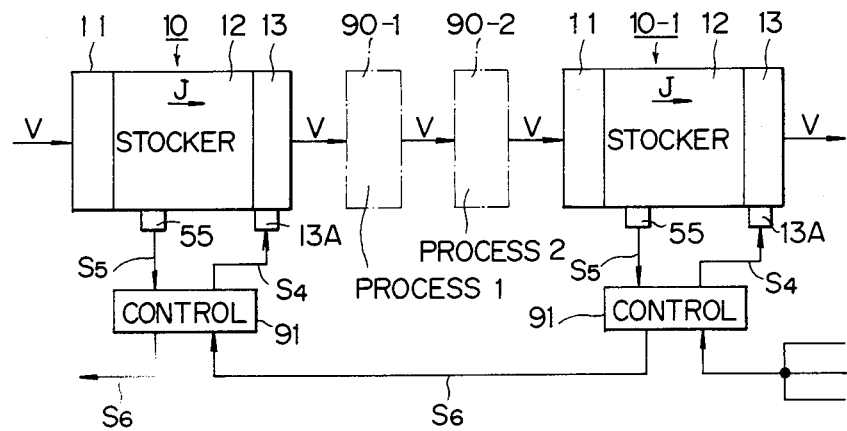
Figure 15:
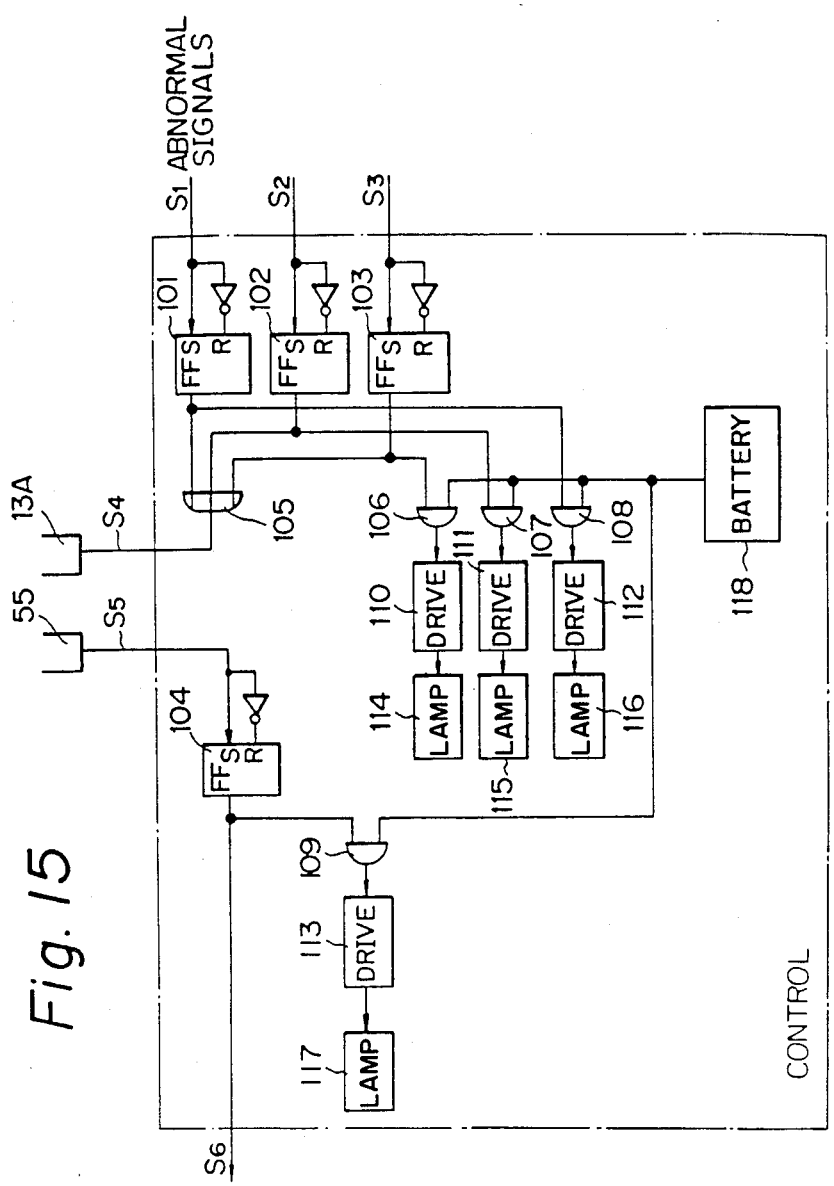
FIG. 15 is a detailed block diagram illustrating the stocker control unit shown in FIG. 15; and, FIG. 16 is a schematic block diagram illustrating another embodiment of the stocker control unit.

In FIGS. 14, 15, and 16, reference numeral 10 indicates a preceding plate stocker; 10-1 a downstream plate stocker; 13A driving means of the outlet station 13; 90-1 and 90-2 apparatuses (for instance, machine tools) in the process line; 91 a control unit; S1, S2 and S3 abnormal signals from the subsequent apparatuses; S4 a signal from the control unit 91 to the driving means 13A; S5 a signal from a full load detecting sensor 55 to the control unit 91; S6 a signal from the control unit 91 to the preceding apparatus; and V flow of the plates 15. The control unit 91 receives the abnormal signals from the subsequent apparatuses to control the driving means 13A of the outlet station 13 and, on the other hand, receives the signal from the full load detecting sensor 55 to control the preceding apparatus. The driving means 13A includes the above mentioned discharge means 13-2 (FIG. 8), stopper 4 (FIGS. 2 and 3) and discharge belts 36-1 and 36-2 (FIG. 8).

In FIGS. 14 and 15, the abnormal signals S1–S3 include signals generated during an abnormal situation in the subsequent apparatuses (for example, machine tools) located downstream of the stocker 10 and signals generated when the subsequent stocker (such as, the stocker 10-1 in FIG. 16) arranged downstream of the above-mentioned subsequent apparatuses of process stops the plate receiving operation. If the control unit 91 having flip-flops 101, 102, and 103 receives any one of these abnormal signals S1–S3, the signal S4 is input via an OR gate 105 to the driving means 13A. The driving means 13A thus stops the plate discharge operation in the stocker 10. On the other hand, the signals from the flip-flops 101, 102, and 103 are also input to AND gates 106, 107, and 108. When receiving one of these signals S1, S2, and S3, the power is supplied from a battery 118 through one of the AND gates 106, 107, and 108, respectively, to one of drives 110, 111, and 112, respectively, to turn one one of warning lamps 114, 115, and 116, respectively. On the other hand, the inlet station 11 continues the plate receiving operation of the plates 15 to continuously feed the plates 15 to the stocker section 12, regardless of the operation of the outlet station 13.

If the stocker 12 is filled with the plates 15, the full load detecting sensor 55 inputs a signal S5 to the control unit 91. It should be noted, however, that the full load detecting sensor 55 generates a signal before the stocker 12 is actually filled, so that at least the plates 15 now on the preceding machine of the process can be fully accommodated in the stocker 12. When the control unit 91 receives the signal S5 by a flip-flop 104, the signal S6 is input to the preceding machine (for example, a machine tool situated upstream of the stocker 12 or another machine situated in this line further upstream of that machine). The signal from the flip-flop 104 is also input through an AND gate 109 to a drive 113 to turn on a warning lamp 117 with the power from the battery 118 to display that the stocker 12 is fully loaded. Thus, the preceding machine or further preceding machine stops operation after discharging the plates 15 now on that machine. As understood from the above, in the stocker 12 according to the present invention, the plate receiving operation and the plate discharging operation are carried out independently from each other, even when one of the preceding and subsequent apparatuses or machines in the process line stops for any reason.

According to an embodiment shown in FIG. 16, if the subsequent plate stocker 10-1, which is arranged downstream of the machines 90-1 and 90-2 in the process line, generates an abnormal signal S6 for any reason, such as, being fully loaded with plates 15, the signal S6 is input to the control unit 91 of the preceding stocker 10 in the same manner as mentioned above.

I claim:
1. A plate stocker, comprising:
a plate inlet station comprising means for feeding plates one by one in a flat orientation in a horizontal direction;
a plate outlet station comprising means for feeding plates one by one in the flat orientation in the horizontal direction; and
a plate stock section adjacent said plate inlet and outlet stations, said plate inlet station feeding the plates toward said plate stock section and said plate outlet station feeding the plates away from said plate stock section, said plate stock section comprising:
a looped-rail extending between said plate inlet station and said plate outlet station, and having an upper horizontal rail section, a lower horizontal rail section and first and second semicircular sections coupling the horizontal rail sections;

a plurality of plate holders freely movably supported along said looped-rail, said holders holding plates in an upright state when said holders are supported on the upper rail section of said looped-rail, each of said holders is movably supported on said looped-rail and each holder extends outward from and perpendicular to said looped-rail forming an extension, the extension of said holder defines a U-shaped frame viewed from the direction of the movement of said holder in the upper rail section, and said U-shaped frame has an inner groove for receiving therein a plate;

first turning means, located at the first semi-circular section, for receiving the plates in said holders one by one from the plate inlet station in a horizontal state and for turning the plates to a vertical state by turning each of said holders from a downward extending position to an upward extending position along said looped rail;

moving means for moving said holders around said looped-rail, along said upper rail section toward said plate outlet station while holding plates and along said lower rail section backward to said plate inlet station while not holding plates, said moving means including engaging means for automatically engaging with and disengaging from said holders to move and stock the plates; and stoppers arranged on the upper and lower sections of said looped-rail at downstream sides thereof, respectively, with respect to the direction of the movement of said holders, said stoppers disengaging said holders from said moving means; and second turning means, located at the second semi-circular section, for turning the plates to the horizontal state by turning each of said holders from the upward extending position to the downward extending position along said looped-rail, and for discharging the plates one by one from said holders in the horizontal state.

2. A plate stocker, comprising:

a plate inlet station comprising means for feeding plates one by one in a flat orientation in a horizontal direction;

a plate outlet station comprising means for feeding plates one by one in the flat orientation in the horizontal direction; and a plate stock section adjacent said plate inlet and outlet stations, said plate inlet station feeding the plates toward said plate stock section and said plate outlet station feeding the plates away from said plate stock section, said plate stock section comprising:

a looped-rail extending between said plate inlet station and said plate outlet station, and having an upper horizontal rail section, a lower horizontal rail section and first and second semicircular sections coupling the horizontal rail sections;

a plurality of plate holders freely movably supported along said looped-rail, said holders holding plates in an upright state when said holders are supported on the upper rail section of said looped-rail;

first turning means, located at the first semi-circular section, for receiving the plates in said holders one by one from the plate inlet station in a horizontal state and for turning the plates to a vertical state by turning each of said holders from a downward extending position to an upward extending position along said looped rail;

moving means for moving said holders around said looped-rail, along said upper rail section toward said plate outlet station while holding plates and along said lower rail section backward to said plate inlet station while not holding plates, said moving means including engaging means for automatically engaging with and disengaging from said holders to move and stock the plates;

stoppers arranged on the upper and lower sections of said looped-rail at downstream sides thereof, respectively, with respect to the direction of the movement of said holders, said stoppers disengaging said holders from said moving means; and second turning means, located at the second semi-circular section, for turning the plates to the horizontal state by turning each of said holders from the upward extending position to the downward extending position along said looped-rail, and for discharging the plates one by one from said holders in the horizontal state, each of said holders being movably supported on said looped-rail and each holder extending outward from and perpendicular to said looped-rail, and said first turning means comprising:

a driving disc rotatably supported about an axis of said first semi-circular section;

a plurality of arms radially arranged on said disc at predetermined intervals radially projecting outward and retracting inward; and a cam for moving said arms radially outward to engage the arms with each holder at the downward extending position and radially inward to disengage the arms from each holder at the upward extending position.

3. A plate stocker, comprising:

a plate inlet station comprising means for feeding plates one by one in a flat orientation in a horizontal direction;

a plate outlet station comprising means for feeding plates one by one in the flat orientation in the horizontal direction; and a plate stock section adjacent said plate inlet and outlet stations, said plate inlet station feeding the plates toward said plate stock section and said plate outlet station feeding the plates away from said plate stock section, said plate stock section comprising:

a looped-rail extending between said plate inlet station and said plate outlet station, and having an upper horizontal rail section, a lower horizontal rail section and first and second semicircular sections coupling the horizontal rail sections;

a plurality of plate holders freely movably supported along said looped-rail, said holders holding plates in an upright state when said holders are supported on the upper rail section of said looped-rail;

first turning means, located at the first semi-circular section, for receiving the plates in said holders one by one from the plate inlet station in a horizontal state and for turning the plates to a vertical state by turning each of said holders from a downward extending position to an upward extending position along said looped rail;

moving means for moving said holders around said looped-rail, along said upper rail section toward said plate outlet station while holding plates and along said lower rail section backward to said plate inlet station while not holding plates, said moving means including engaging means for automatically engaging with and disengaging from said holders to move and stock the plates;

stoppers arranged on the upper and lower sections of said looped-rail at downstream sides thereof, respectively, with respect to the direction of the movement of said holders, said stoppers disengaging said holders from said moving means; and second turning means, located at the second semi-circular section, for turning the plates to the horizontal state by turning each of said holders from the upward extending position to the downward extending position along said looped-rail, and for discharging the plates one by one from said holders in the horizontal state, each of said holders being movably supported on said looped-rail and each holder extending outward from and perpendicular to said looped-rail, said second turning means comprising:
a driving disc rotatably supported about an axis of said second semi-circular section;
a plurality of arms radially arranged on said disc at predetermined intervals radially projecting outward and retracting inward; and
a cam for moving said arms radially outward to engage the arm with the holder at the upward extending position and radially inward to disengage the arms from the holder at the downward extending position, and said plate outlet station comprising means for detecting the plates when each of the plates passes through a predetermined position on said plate outlet station, and said disc being driven in response to detection by said plate detecting means so that a subsequent plate is transferred from said plate discharge means to said plate outlet station after a preceding plate has passed through said predetermined position.

4. A plate processing system, comprising:
a plate inlet station;
a plate outlet station; and
a plate stock section adjacent said plate inlet and outlet stations, said plate stock section comprising:
a looped-rail extending between said plate inlet station and said plate outlet station and having a first rail section and a second rail section;
a plurality of plate holders freely movably supported along said looped-rail;
moving means for moving said holders around said looped-rail, along said first rail section toward said plate outlet station while holding plates and along said second rail section backward to said plate inlet station while not holding plates, said moving means comprising an endless belt arranged along said looped-rail to run in the vicinity of said holders;
engagement means, arranged on said endless belt and said holders for automatically engaging to feed said holders when the endless belt is driven, said engagement means comprising magnetic material on said endless belt and magnetic material attached to each of said holders opposite to said endless belt; and
stoppers arranged on the first and second sections of said looped-rail at downstream sides thereof, respectively, with respect to the direction of the movement of said holders, said stoppers disengaging said holders from said engagement means of the endless belt to stop said holders.

5. A plate processing system, as recited in claim 4, wherein
said plate inlet station is connected to a preceding process and said plate outlet station is connected to a subsequent process; said looped-rail includes first and second semi-circular sections coupling the first and second rail sections, and said stocker further comprises:
first turning means, located at the first semi-circular section, for receiving the plates in said holders one by one from the plate inlet station in a horizontal state and for turning the plates to a vertical state by turning each of said holders from a downward extending position to an upward extending position along said looped rail;
second turning means, located at the second semi-circular section, for turning the plates to the horizontal state by turning each of said holders from the upward extending position to the downward extending position along said looped-rail, and for discharging the plates one by one from said holders in the horizontal state and operating independently of said first turning means;
means for detecting a plate full load condition in the plate stock section; and
stock control means for controlling plate stocking, said stock control means comprising:
means for detecting an abnormal condition of said subsequent process;
means for stopping said preceding process when said plate stock section is filled with plates; and
means for stopping discharging when said subsequent process is in the abnormal condition.

6. A plate processing system as set forth in claim 5, wherein said subsequent process is another plate stocker.

7. A plate processing system as set forth in claim 5, wherein said preceding process is another plate stocker.

8. A plate stocker, comprising:
a plate inlet station;
a plate outlet station; and
a plate stock section adjacent said plate inlet and outlet stations, said plate stock section comprising:
a looped-rail adjacent said plate inlet station and plate outlet station and having an upper rail section and a lower rail section;
a plurality of plate holders freely movably supported along said looped-rail, said holders holding plates in an upright state when said holders are supported on the upper section of the looped-rail;
means for receiving the plates one by one from said plate inlet station to transfer them to said holders;
means for moving said holders around said looped-rail, along said first rail section toward the outlet station while holding plates and along said second rail section backward to the inlet station while not holding plates;
discharging means for discharging the plates one by one from said holders in said plate stock section by turning the plates from a vertical state to a horizontal state to transfer them to said plate outlet station; and said plate outlet station comprising;
  means for feeding plates one by one in the horizontal state from said plate stock section;
  means for detecting a height of the plates in the upright position arranged adjacent to said discharging means; and
  plate detecting means for detecting the plates when each of the plates passes through a predetermined position in accordance with the height of the plate.

9. A plate stocker as set forth in claim 8, wherein:
said looped-rail defines a plate passage;
said height detecting means comprises a vertical column which is transversely movable to and from the plate passage defined by said looped-rail, said column having a vertical groove allowing the vertical column to come into engagement via said vertical groove with a side edge of each of the plates, and a plurality of sensors spacedly arranged in the vertical direction in said groove; and
said plate detecting means comprises a plurality of sensors spacedly arranged in the direction of the movement of the plates.

* * * * *

UNITED STATES PATENT AND TRADEMARK OFFICE
CERTIFICATE OF CORRECTION

PATENT NO. : 4,751,998
DATED : June 21, 1988
INVENTOR(S) : Naoyuki Yano

It is certified that error appears in the above-identified patent and that said Letters Patent is hereby corrected as shown below:

```
Front Page [57] Abstract,
     line 3, "toward" should be --to--;
     line 4, after "The" insert --plate--.

Col. 4,    line 4, "15" should be --14--;
           line 42, "tived" should be --tive--.

Col. 11,   line 54, "signalf rom" should be --signal from--.

Col. 12,   line 15, "one one" should be --on one--.

Col. 15,   line 28, "arm" should be --arms--.
```

Signed and Sealed this

Fifteenth Day of November, 1988

*Attest:*

DONALD J. QUIGG

*Attesting Officer*   *Commissioner of Patents and Trademarks*